United States Patent [19]

Mitchell

[11] Patent Number: 4,605,471

[45] Date of Patent: Aug. 12, 1986

[54] METHOD OF MANUFACTURING PRINTED CIRCUIT BOARDS

[75] Inventor: Curt E. Mitchell, Cambridge, Ohio

[73] Assignee: NCR Corporation, Dayton, Ohio

[21] Appl. No.: 749,594

[22] Filed: Jun. 27, 1985

[51] Int. Cl.$^4$ ............................ C23F 1/02; B44C 1/22; C03C 15/00; C03C 25/06

[52] U.S. Cl. ............................ 156/645; 29/852; 156/652; 156/656; 156/659.1; 156/902; 427/97

[58] Field of Search ............... 156/644, 645, 652, 656, 156/659.1, 661.1, 664, 666, 901, 902; 29/852; 174/68.5; 427/97; 204/15, 20, 21, 23, 27, 32 R, 435

[56] References Cited

U.S. PATENT DOCUMENTS

| | | | |
|---|---|---|---|
| 3,704,208 | 11/1972 | Russo | 204/15 |
| 4,024,631 | 5/1977 | Castillero | 29/625 |
| 4,312,897 | 1/1982 | Reimann | 156/901 X |
| 4,325,780 | 4/1982 | Schulz | 156/902 X |
| 4,444,619 | 4/1984 | O'Hara | 29/852 X |
| 4,487,654 | 12/1984 | Coppin | 156/645 |
| 4,525,246 | 6/1985 | Needham | 29/582 X |

Primary Examiner—William A. Powell
Attorney, Agent, or Firm—Wilbert Hawk, Jr.; Albert L. Sessler, Jr.; Richard W. Lavin

[57] ABSTRACT

A method of producing a printed circuit board comprising the steps of applying a layer of electrically conductive material on at least one side of a printed circuit board, cleaning the surface of the electrical conductive layer, printing a plating resist onto the layer so as to expose only the required trace area of an electrical circuit pattern, electroplating over the layer of electrically conductive material a layer of nickel metal which has a melting point sufficiently high to prevent movement in a molten state during a subsequent soldering operation, removing the plating resist by etching leaving a nickel layer on the trace areas of the circuit pattern, applying a solder resist to the layer so as to expose only the plated-through holes and other connecting sites of the board such as contact fingers and connecting pads, removing the nickel metal from the exposed area of the board, and applying a layer of sealant to retard copper oxidation and/or promote solderability of the exposed plated-through holes, the connecting pads and the contact fingers.

6 Claims, 6 Drawing Figures

FIG. IA
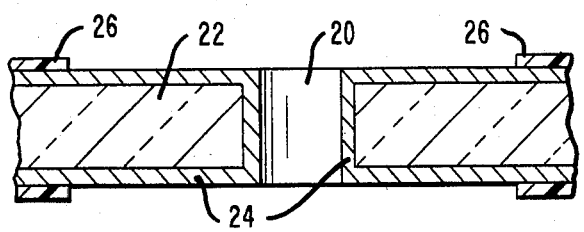
FIG. IB
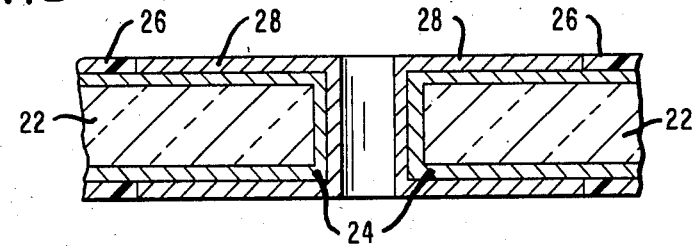
FIG. IC
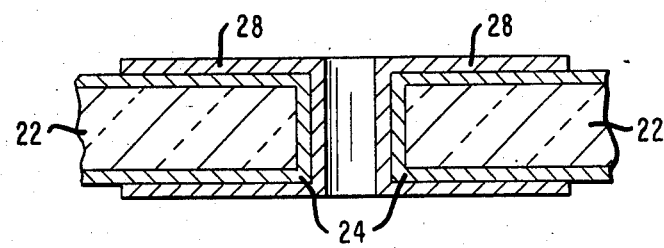
FIG. ID
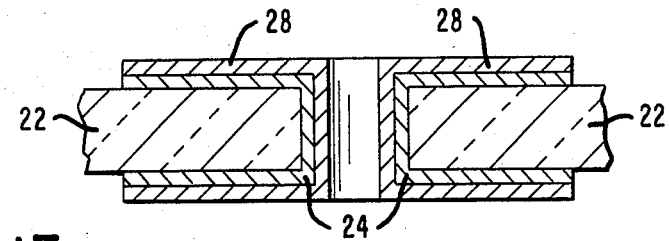
FIG. IE
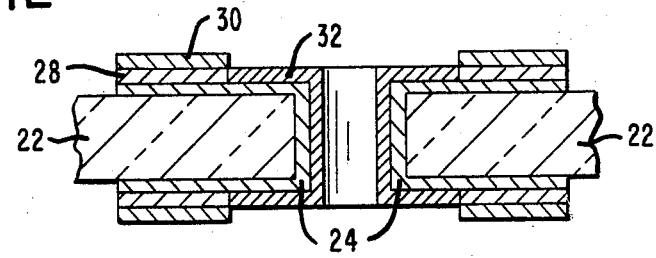

METHOD OF MANUFACTURING PRINTED CIRCUIT BOARDS

BACKGROUND OF THE INVENTION

The present invention relates to the manufacturing of printed circuit boards and more particularly to the manufacturing of a printed circuit board in which nickel is used as the etch resist in forming the electrical conducting areas of the board.

A printed circuit board is employed as a low cost vehicle for interconnecting various components in an electrical circuit. A simple printed circuit board can be made by applying a resist material to a copper layer that is laminated to a fiberglass core so as to define circuit patterns and chemically etching away the unwanted copper layer. The particular method of applying the resist, the type of resist, and the type of etchant are process details that are dictated by the end requirement of the printed circuit board and the facilities that are available. In the manufacture of the printed circuit boards, holes are drilled through the board and copper is then plated into the hole for interconnecting the leads of circuit components located on the boards prior to a mass soldering operation which may be accomplished in a conventional manner such as wave soldering of the circuit board. The most commonly used solder is a tin-lead eutectic alloy of 63% tin and 37% lead which has a relatively sharp melting point of around 361 degrees F. The operating temperature for associated wave soldering is somewhere in the range of 425 degrees–525 degrees F., with 490 degrees F. being optimum. Poor solderability can take place at lower temperatures. Higher soldering temperature can damage heat sensitive components, can cause board warpage and/or cause excessive oxidation of molten solder. During the wave soldering operation, undesirable side effects that may occur include excessive solder consumption, which increases the weight of the wiring board when large ground plane areas thereof become coated with solder, and a tendency for the solder to bridge between circuit pads and traces as well as between the adjacent circuit traces. In order to reduce the amount of solder that is applied to circuit areas such as ground planes and traces and to reduce the tendency for solder bridging, and to protect electrical circuitry from contamination, a solder mask or solder resist is often applied over bare copper circuit traces and bare ground planes. This resist is an organic coating that is applied over the entire board, except for windows around areas where a solder joint is required such as in circuit pads and connecting fingers. This mask works well over bare copper traces and ground planes.

In order to improve the solderability of circuit pads and holes, the practice is to precoat them with solderable metal. The most desirable material for this application is an alloy of tin and lead which is similar to the eutectic alloy that is actually used in the subsequent wave soldering operation. The tin-lead coating is generally electroplated onto the pads and in the holes and then reflowed. It may also be applied as a solder dip coating. Although other electro-deposited metals such as tin, nickel, tin-nickel alloy and even gold may be used to cover the copper layer-traces, solder plate is preferred due to its compatibility with the solder material used in wave soldering and the fact that it will melt during wave soldering and cause a liquid-to-liquid contact. Tin is next in preference with a melting point of only 450 degrees F. Tin-nickel does not solder well and has a very high melting point which is much greater than that of tin-lead. Gold is cost prohibitive and a severe contaminant in the wave solder process, as well as causing brittle solder joints. Nickel provides strength to the traces but has poor solderability.

In the past, when a tin-lead solder overplating was used as an etch resist for the copper traces and ground planes and had a solder mask applied over it, the solder under the mask would melt and flow sufficiently during the wave soldering operation to cause bridging of circuit traces under the solder mask as well as wrinkling and/or rupture of the solder mask itself. This wrinkling is unattractive and subjects the mask to peeling and cracking which allows acid based flux to attack the circuit patterns and reduces the mask's effectiveness as a conformal coating that is employed to protect the circuit from the elements; that is, high humidity and corrosive atmosphere. The basic problem then is to produce a circuit board that solders well and has a solder mask that will not wrinkle during a wave soldering operation and has traces that will not bridge under the solder mask.

One approach is to apply the solder mask over bare copper (SMOBC) traces and ground planes. Another prior art technique is to chemically remove any tin-lead solder overplating from copper traces and ground planes prior the application of the solder mask. This adds the cost of an additional removal operation to the manufacture of the circuit board as well as the problem of removing lead from the waste products. Another prior art technique is to overplate the copper of the circuit patterns with a high melting point metal, i.e., a tin-nickel alloy or nickel itself, and then selectively plate tin-lead solder on only the areas of holes and pads, a solder mask then being applied over the tin-nickel on the traces and ground planes. Since the melting point of the nickel or tin-nickel overplate is much greater than that of the tin-lead solder in the wave soldering operation, the nickel or tin-nickel does not melt and there is no deformation of the solder mask. Another prior art technique is to use nickel as an etch resist and then chemically activate the nickel to allow solder to adhere thereto. This is because when nickel has been used as an etch resist, it has been found that a condition of poor solderability occurred when circuit components were attached to the circuit board by mounting the components to the pads and the plated-through holes in the board. Examples of these prior art techniques may be found in U.S. Pat. Nos. 3,704,207; 4,024,631; 4,088,545; 4,104,111; and 4,487,654.

SUMMARY OF THE INVENTION

The present invention is directed to a method for manufacturing a printed circuit board comprising the steps of applying a layer of electrically conductive material, such as copper, on at least one side of a substrate and on the walls of any through holes present, cleaning the surface of the electrically conductive layer, applying a plating resist onto the layer so as to expose only the required traces of the surface when processed, electroplating over the layers of the electrically conductive material a layer of a metal such as copper and then a second layer of nickel which acts as an etch resist having a melting point sufficiently high to prevent movement in a molten state at temperatures encountered during wave soldering, removing the plating resist and the layer of electrically conductive material by etching, leaving a layer of copper-nickel on the traces of the surface, gold plate any contact fingers if required, applying a solder resist to the layer so as to expose only plated-through holes and other connecting sites of the board such as pads or contact fingers, applying a temporary mask to any contact fingers and other connecting sites requiring it, selectively removing the nickel metal from the exposed areas of the board, removing the temporary mask from the fingers or other areas so masked and applying a layer of sealant to retard copper oxidation and/or promote solderability to the exposed plated-through holes and the other connecting sites.

From the foregoing, it can be seen that it is a primary object of the present invention to provide an improved method of manufacturing printed circuit boards.

It is another object of this invention to provide an improved method of manufacturing printed circuit boards having a solder resist applied over a layer of nickel which in turn is applied over a layer of copper for a first portion of the circuit board and a layer of highly solderable material or sealant applied over the copper layer on a second portion of the circuit board.

It is a further object of this invention to provide a low cost method of manufacturing nickel plated printed circuit boards whose assembly soldering characteristics equal or surpass those of conventional tin-lead electroplated printed circuit boards.

It is a further object of this invention to provide a printed circuit board whose assembly soldering characteristics equal those of Solder Mask Over Bare Copper (SMOBC) printed circuit boards without removing the etch resist from all portions of the board.

BRIEF DESCRIPTION OF THE DRAWING

FIGS. 1A-1E inclusive are cross-sectional views of a portion of a printed circuit board at various stages of manufacture in accordance with the present invention.

DESCRIPTION OF THE PREFERRED EMBODIMENT

Figure 2:
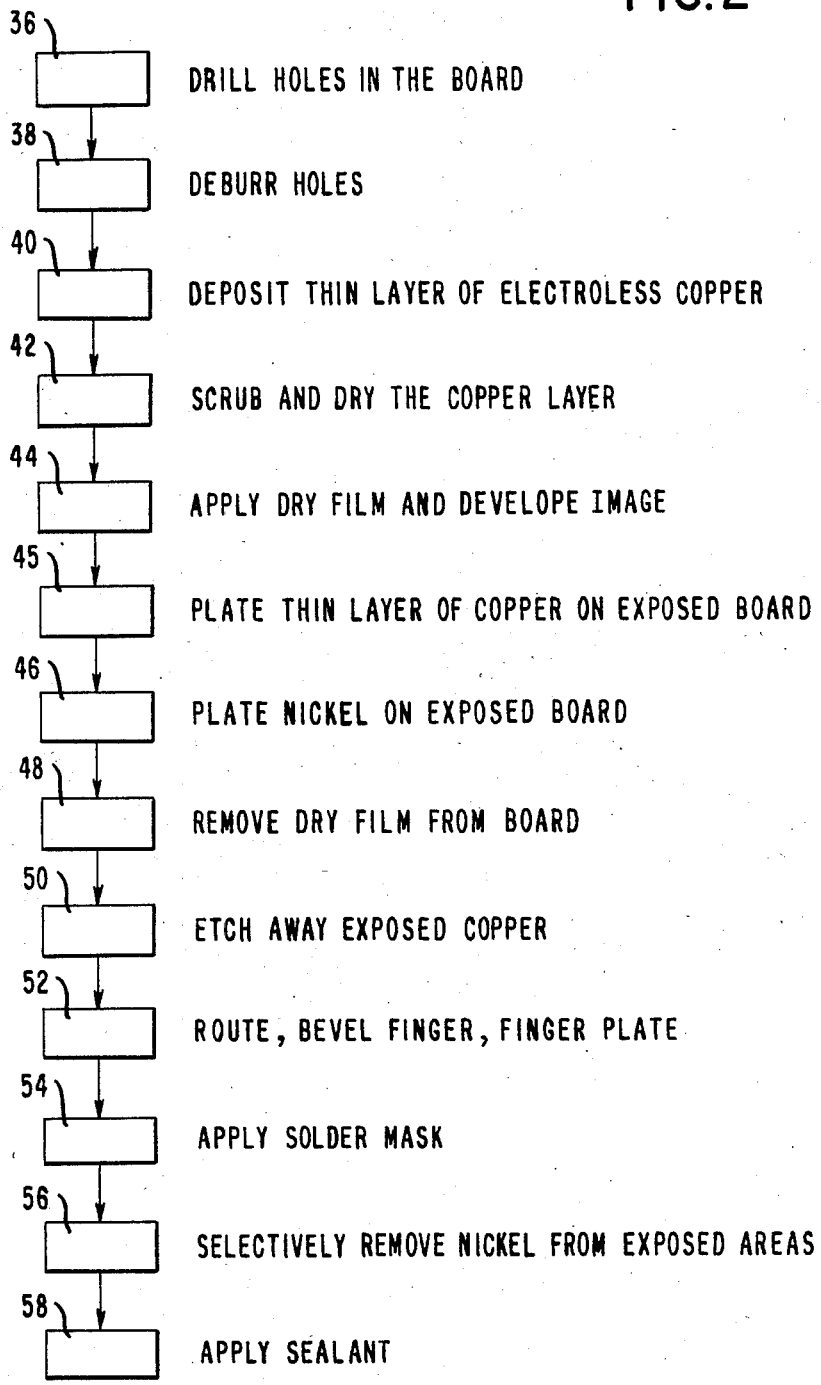
FIG. 2 is a flow diagram showing a sequence of processing steps which may be followed in manufacturing a nickel printed circuit board in accordance with the present invention.

The representations of the printed circuit board as disclosed in FIGS. 1A-1E inclusive, are greatly simplified and not drawn to scale, for purposes of clearness of illustration and disclosure of the method of this invention. More specifically, the structure and electrical circuit pattern of the circuit board behind the holes 20 are not shown, and the thicknesses of the various coatings are greatly exaggerated and are not shown in the desired proportions. In the following description, the necessary art work for the conventional steps of FIG. 2 that are normally used in the manufacture of the printed circuit board are not described in detail since they are well known in the prior art.

Referring now to FIGS. 1A-1E inclusive, holes 20 located within the substrate or printed circuit board 22 for the purpose of this description are shown to include all holes that require plating the walls of the hole such as component holes and connecting holes. The holes 20 are first drilled through the circuit board 22 which may in the present embodiment consist of a glass-epoxy resin material. After the holes 20 are drilled, a thin layer 24 (FIG. 1A) of copper is chemically deposited on both sides of the circuit board and walls of the holes 20.

After the copper layer 24 is deposited onto the surface of the circuit board 22 and holes 20, a plating resist 26 (FIG. 1A) such as a solvent dry film is applied to the full surface of the copper layer 24 after which the art work comprising a circuit mask is placed over the film and the film is exposed and developed, which leaves as exposed copper only those areas which were covered by the circuit mask and which will form the traces of the circuit pattern and any pads or edge connectors associated therewith. After the film 26 has been developed, an additional layer (optional) of copper may be deposited, followed by a thin layer of nickel metal 28 (FIG. 1B) being deposited on the exposed areas of the board. If the circuit board has connecting tabs and contact fingers, the tabs and contact fingers are also nickel plated at this time. After the nickel metal has been deposited, the film 26 is chemically removed by insertion into a methylene chloride bath which leaves a copper-nickel layer on the exposed traces and the plated through holes 20 (FIG. 1C). The coating of the nickel metal 28 has a typical thickness of between 0.2 to 0.6 mils which is sufficient to effectively operate as a metallic etch resist for the copper 24 that it covers.

The printed circuit board 22 is then subjected to an alkaline ammoniacal bath which etches away the exposed copper but which does not attack the layer 28 of nickel metal now covering the copper covered traces of the board and the plated through holes 20 (FIG. 1D). One example of an alkaline ammoniacal bath solution that may be used is commercially available under the tradename "High Speed Ac-Cu Guard" from the Hunt Chemical Corp. of Palisades Park, N.J. An organic solder mask 30 (FIG. 1E) is then applied to the surface of the board except on the plated through holes, pads, fingers and other connecting sites. The application of the solder mask 30 may be accomplished by screen printing, dry film or other methods which are well known in the art. The connecting tabs (also called fingers) (not shown) are protected in some manner (if required) such as plater masking tape. The board is then dipped into a commercial nickel stripping chemical bath such as METEX NICKEL STRIPPER BR which may include Sodium Metanitro-benzene Sulfonate, Ammonium Thiocyanate, Nickel Salts and sulfuric acid. METEX is a registered trademark of the MacDermid Corporation of Waterbury, Conn. The nickel stripping solution, having a temperature of between 150 degrees F. and 170 degrees F., which is required to have little effect on the copper layer 24, and the circuit board 22, but which readily dissolves nickel, will remove the exposed nickel coating 28 from the plated-through holes 20 and any other areas not covered by the solder mask 30. The plater masking tape (or other temporary mask) is then removed from the fingers and replaced by tape which prevents tin-lead alloy solder from adhering to the fingers. The board 22 is then subjected to a hot air solder leveling process by which a solder layer 32 (FIG. 1E) of tin/lead alloy is deposited on the copper plated-through holes 20 providing increased solderability of the holes and other soldering sites.

Referring now to FIG. 2, there is shown a flow chart of the steps in the manufacture of the printed circuit board according to the present invention. The holes 20 (FIG. 1A) are first drilled in the board 22 (Block 36) after which they are deburred (block 38) and a thin layer of copper 24 (block 40) is deposited on the board 22 including the holes 20 and any connecting tabs and fingers. The copper plated board is then scrubbed and dried (block 42) after which a dry film 26 (FIG. 1B) together with the art work representing the circuit pattern outline is applied to the copper layer 24 (block 44). The film is developed, producing a negative image of the circuit on the copper layer 24 in which the traces and other connecting elements are exposed while the remaining area of the board surface is covered by the film. A second thin layer of copper is then deposited on the board (block 45) if required.

The board with the film thereon is then subjected to a plating operation (block 46) in which nickel 28 (FIG. 1C) is applied over the exposed copper areas, the nickel acting as an etch resist during a subsequent etching operation in which the copper is removed from the board. The nickel will be deposited on the copper plated traces, pads, holes, contact fingers, and other connecting sites in which the copper layer is exposed. The contact fingers will be normally gold plated after the application of the nickel layer. The dry film 26 is chemically stripped away from the surface of the board (block 48) leaving the copper layer exposed except for those areas covered by the nickel layer (FIG. 1C). The board is then immersed in the alkaline ammoniacal etching solution (block 50) which will dissolve all the exposed copper on the board leaving only the top surface of the glass-epoxy board 22 (FIG. 1A) exposed except for those areas covered by the nickel layer 28 (FIG. 1C). If the board has any fingers or tabs extending from the edge of the board, they are beveled and plated (if required) (block 52) for ease of insertion into board connecting elements. The final board outline is created via various routing processes (pin-route, blanking, etc.) which are well known in the art. A solder mask 30 (FIG. 1D) is then applied (block 54) to the surface of the circuit board except the plated-through holes and the other connecting sites. A temporary mask such as plater masking tape is applied to the contact fingers if necessary in order to protect them from the effects of the nickel dissolving solution. The board is then dipped in the nickel dissolving solution (block 56) which removes the nickel from the plated-through holes and the other exposed connecting areas leaving such areas with a layer of copper. Since bare copper will rapidly form an oxide layer which adversely affects the solder-ability of the copper, the copper must be rendered free of oxides by the application of a sealant to maintain long term solderability. This is usually accomplished by applying solder (tin/lead) 32 (FIG. 1E) (block 58) to the holes and the other connecting areas such as pads and sites for surface mount device attachments by hot air leveling. Connecting fingers are masked with a temporary solder mask prior to this operation in order to retain their gold finish after the previous plater masking tape has been removed.

While the principal features of the invention have been illustrated and described, it should be readily apparent to those skilled in the art that many changes and modifications can be made in the invention presented without departing from the spirit and true scope of the invention. Accordingly, the present invention should be considered as accomplishing all such changes and modifications of the invention that fall within the broad scope of the invention as defined by the appended claims.

I claim:

1. In a method of fabricating a printed circuit board having a solder mask applied over at least a portion of the circuit board other than connecting pads and holes therethrough of a prescribed electrical circuit pattern in a conductive material on the circuit, the improvement comprising the steps of:
   (a) applying on a portion of the conductive material a thin coating of metallic etch resist composed of a nickel metal which will not flow detrimentally at the temperature of solder used in a subsequent solder operation;
   (b) applying a solder resist on the board except the plated-through holes and other connecting sites;
   (c) selectively removing the nickel from the plated-through holes and other connecting sites; and
   (d) applying a layer of solder to the exposed plated-through holes and other connecting sites.

2. The method of claim 1 in which the layer of nickel has a thickness of between 0.2–0.6 mils.

3. The method of claim 2 which further includes the steps of
   (a) depositing a thin layer of electroless copper to the board on at least one side of the board and the walls prior to the application of the metallic etch resist;
   (b) cleaning the surface of the copper layer;
   (c) applying a plating resist to the clean surface of the copper layer so as to expose only the required electric circuit pattern; and
   (d) electroplating over the entire exposed electrical circuit pattern a second layer of copper.

4. The method of claim 2 in which the circuit board includes electrical contact fingers, the method further including the steps of
   (a) applying a nickel metallic etch resist to the contact fingers;
   (b) applying a first temporary mask to the contact fingers prior to the removal of the nickel etch resist; and
   (c) applying a second temporary mask to the contact fingers prior to the step of applying the layer of solder to the exposed plated-through holes and other connecting sites.

5. A method of fabricating printed circuit boards having connecting pads and contact fingers comprising the steps of
   (a) drilling through holes required on the printed circuit board;
   (b) removing any drill burrs created in the process of drilling the holes;
   (c) applying a first layer of electrically conductive material on at least one side of the printed circuit board and the walls of the through holes;
   (d) cleaning the surface of the electrical conductive material;
   (e) applying a plating resist onto the layer of the electrical conductive material by exposing and developing a dry film and a circuit pattern mask so as to expose only the required electric circuit pattern of the printed circuit board;
   (f) electroplating a second layer of electrical conductive material over the exposed electrical conductive pattern;
   (g) electroplating over the exposed electrical conductive pattern a layer of nickel metal having a melting point sufficiently high to prevent movement in a molten state at the temperatures encountered during a subsequent soldering operation;
   (h) removing the plating resist;
   (i) removing the layer of electrically conductive material from the non-pattern areas by etching;

(j) applying a solder resist to the circuit pattern so as to expose only plated-through holes and other connecting sites of the printed circuit board;

(k) selectively removing the layer of nickel from any remaining exposed areas including connecting pads and plated-through holes; and (l) applying a layer of solder to the areas which have the nickel removed for sealing the underlying copper layer allowing it to maintain good soldering characteristics.

6. The method of claim 5 which further includes the steps of (a) electroplating over the connecting pads and contact fingers a layer of nickel metal;

(b) applying a nickel etch resist to the connecting pads and contact fingers prior to removing the nickel from the exposed area of the printed circuit board;

(c) removing the nickel etch resist from the connecting pads;

(d) applying a solder resist to the connecting pads and the contact fingers; and (e) applying a layer of solder to the connecting pads and contact fingers.

* * * * *